(12) United States Patent
Choy

(10) Patent No.: US 6,173,632 B1
(45) Date of Patent: Jan. 16, 2001

(54) SINGLE STATION CUTTING APPARATUS FOR SEPARATING SEMICONDUCTOR PACKAGES

(75) Inventor: Tan Huek Choy, Singapore (SG)

(73) Assignee: Semiconductor Technologies & Instruments, Inc., Dallas, TX (US)

( * ) Notice: Under 35 U.S.C. 154(b), the term of this patent shall be extended for 0 days.

(21) Appl. No.: 09/197,996

(22) Filed: Nov. 23, 1998

(51) Int. Cl.[7] .................................................. B32B 31/00
(52) U.S. Cl. .................................... 83/13; 83/98; 83/100; 83/518; 83/531; 83/556; 156/1; 156/250; 156/510
(58) Field of Search ............................. 83/98, 100, 518, 83/531, 556, 13; 156/250, 251, 510

(56) References Cited

U.S. PATENT DOCUMENTS

| | | | |
|---|---|---|---|
| 3,701,276 | * 10/1972 | Malmgren | 83/518 |
| 3,748,791 | * 7/1973 | Foster | 83/518 |
| 4,250,784 | * 2/1981 | Bredow | 83/518 |
| 4,412,469 | * 11/1983 | Hirata et al. | 83/556 |
| 4,628,780 | * 12/1986 | Hicks | 83/98 |
| 4,947,717 | * 8/1990 | Whistler | 83/98 |
| 4,989,482 | * 2/1991 | Mason | 83/98 |
| 5,425,833 | * 6/1995 | Fujimoto et al. | 156/344 |
| 5,614,443 | * 3/1997 | Nakashima et al. | 437/209 |
| 5,616,886 | * 4/1997 | Romero et al. | 174/52.4 |
| 5,906,702 | * 5/1999 | Crawford, Jr. et al. | 83/100 |
| 5,967,962 | * 10/1999 | Huang et al. | 83/100 |

* cited by examiner

Primary Examiner—M. Rachuba
Assistant Examiner—Sean Pryor
(74) Attorney, Agent, or Firm—Akin, Gump, Strauss, Hauer & Feld, L.L.P.

(57) ABSTRACT

Apparatus for cutting single or multiple semiconductor packages from a multilayer substrate wherein the semiconductor packages are partially encapsulated by an elastomer sealant layer disposed on a polymer film layer of the substrate. The apparatus includes upper and lower die assemblies mounted for movement relative to each other on a support base. The upper die assembly includes an actuator and a die block supporting plural sets of cutter blades arranged in patterns to cut rectangular shaped semiconductor packages out of the substrate in a single cutting operation at a single station. The lower die assembly includes plural punch members movable relative to a die block, which includes a support surface for supporting the substrate in a predetermined position as determined by spaced apart locator pins on the lower die assembly registerable with corresponding locator holes in a carrier frame for the substrate. Separated or singulated semiconductor packages are retained by vacuum in recesses in the upper die assembly defined by the cutter blades and the packages are ejected by a burst of compressed air for further processing.

16 Claims, 4 Drawing Sheets

SINGLE STATION CUTTING APPARATUS FOR SEPARATING SEMICONDUCTOR PACKAGES

FIELD OF THE INVENTION

The present invention pertains to a cutting apparatus for separating semiconductor packages, such as ball grid arrays (BGAs) from a substrate wherein the apparatus makes a dual cut at a single station through multiple material layers without creating slivers of material.

BACKGROUND

Certain types of semiconductor packages are fabricated in pre-determined arrays on a substrate, preferably a polyimide tape or film and wherein the packages are encapsulated by an elastomer sealant also deposited on the tape or film. The arrays of semiconductor packages, including the polyimide tape or film substrate structure is secured to a metal frame having a central opening therein such that the packages may be subjected to a cutting operation to cut through the polyimide tape and also through the elastomer sealant layer. Typically, the operation is conducted in two cutting steps at two different stations to completely separate each semiconductor package from the substrate.

The aforementioned prior art method of separating semiconductor packages, particularly micro ball grid arrays ($\mu$BGAs), often introduces errors in the cutting operation due to misalignment of the packages when moved from one cutting station to the next. This action produces slivers or partially cut portions of the package supporting substrate along one or more edges thereof, resulting in costly rework or modification of the packages before they can be further processed. The present invention overcomes the problems associated with prior art cutting methods for separating semiconductor packages from their support structure, as will be described further herein.

SUMMARY OF THE INVENTION

The present invention provides an apparatus and method for cutting semiconductor packages from a substrate support structure for said packages and wherein the cutting operation includes cutting through multiple layers of material at a single station to more accurately define the package edges and to substantially prevent improperly cut edges or slivers of substrate material remaining partially connected to the packages.

In accordance with one important aspect of the present invention an apparatus is provided which includes support structure for supporting an array of semiconductor packages, particularly micro ball grid arrays, wherein multiple packages on the array may be separated from the array substrate film and sealant layers with an accurate cutting action which cuts through the elastomer sealant material as well as the substrate film or tape structure to define the package outline. The array of packages is preferably supported on a carrier frame which is adapted to be supported on a lower die assembly. An upper die assembly is provided with a cutting knife which cuts a rectangular outline of one or more packages by cutting through the elastomer sealant which encapsulates the packages and at least partially cuts through the substrate film or tape in a first part of the operation. A second part of the operation is carried out without removing the array of packages from the lower die assembly by moving a punch part of the lower die assembly upwardly relative to the knife edges to complete the cutting operation. The singulated or separated packages may then be ejected from the upper die assembly for further processing of the packages. The single station cutting method avoids inaccurate cutting of the edges of the semiconductor packages resulting from poor registration of the package arrays in multiple station cutting operations.

In accordance with another aspect of the present invention, a single station semiconductor package cutting or singulation apparatus is provided which includes a punch member which is movable relative to a package support surface and a cutter blade assembly in such a way as to assure that a cut is made completely through multiple layers of material including an elastomer sealant layer and a polymer tape or film layer supporting one or more semiconductor packages. In this way an accurate and complete cut is made to separate or singulate the packages with respect to an array of packages and knife edges of the cutter blades are not required to impact a hard surface during the cutting operation.

The present invention further provides an apparatus for cutting or singulating semiconductor packages and the like wherein an improved arrangement of support structure for a semiconductor package carrier frame is provided and wherein upper and lower die assemblies of the apparatus are advantageously constructed and operated in a manner not appreciated by the prior art.

Those skilled in the art will further appreciate the above-mentioned features and advantages of the apparatus and method of the present invention together with other important aspects thereof upon reading the detailed description which follows in conjunction with the drawings.

DETAILED DESCRIPTION OF A PREFERRED EMBODIMENT

Figure 2:
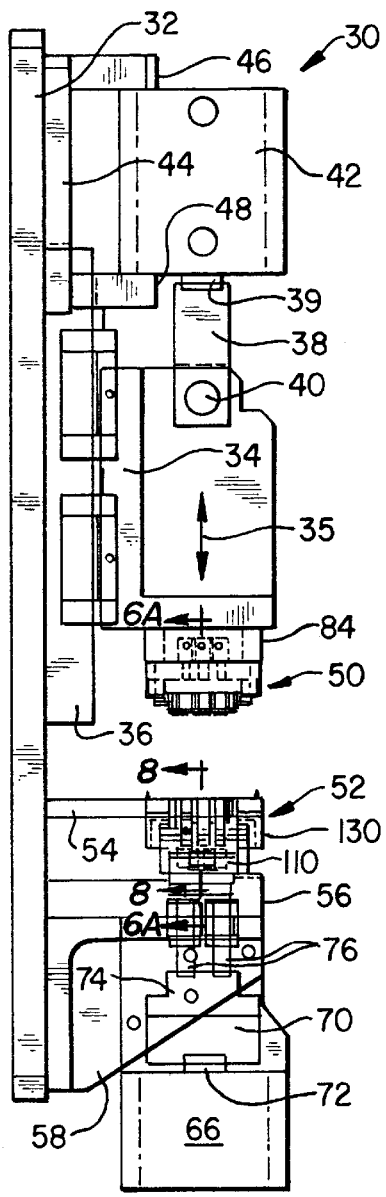
FIG. 2 is a side elevation of the semiconductor package cutting or singulation apparatus of the present invention.

In the description which follows, like parts are marked throughout the specification and drawing with the same reference numerals, respectively. The drawing figures are not necessarily to scale and certain features may be shown in somewhat generalized or schematic form in the interest of clarity and conciseness.

Figure 1:
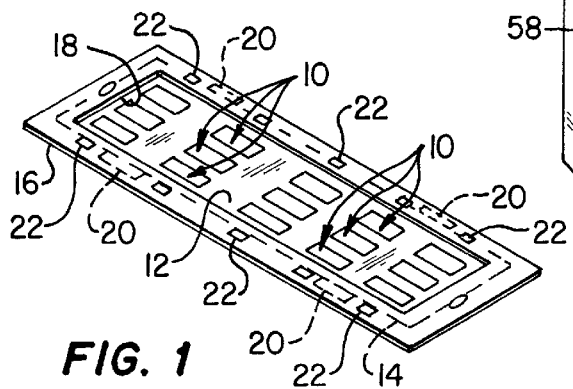
FIG. 1 is a perspective view of an array of semiconductor packages supported on a carrier frame for use in singulating or separating the packages with the apparatus of the present invention.

Referring to FIG. 1, there is illustrated an assembly or an array of semiconductor packages comprising individual packages 10 which are arranged side by side in rows of three packages each, as indicated, and are supported on a substrate 12 including a generally rectangular polymer film or tape-like member 14 and an elastomeric sealant layer 13. The arrangement of the substrate 12 is further illustrated in FIGS. 6A through 6D and FIG. 7. The substrate 12 is a relatively flat planar member and is adapted to be secured to a carrier frame 16 comprising an elongated generally flat plate having a rectangular opening 18 formed therein for exposure of the semiconductor packages 10, as illustrated. The carrier frame 16 may be fabricated of any suitable metal or plastic material.

The array of packages 10 provided on the substrate 12 is preferably secured, temporarily, to the underside of the carrier frame 16 by spaced apart pieces of suitable adhesive material or tape, each indicated by numeral 20. The pieces of tape 20 secure the substrate 12 to the carrier frame 16 on the side opposite that shown in FIG. 1. Other means of attachment of the substrate 12 to the carrier frame 16 may be utilized. The carrier frame 16 is also provided with spaced apart pairs of alignment holes 22 for aligning each row of three semiconductor packages 10 with a package cutting apparatus to be described in further detail herein so that each of the packages 10 may be separated from the substrate 12 along edges of the substrate which are defined by the cutting action. The pairs of alignment holes 22 may be of a selected geometry, either rectangular, square or circular and are preferably square in shape as will be appreciated from a further description of the apparatus of the invention in conjunction with FIG. 5. Other means of dimensional control may be provided such as providing one or more reference surfaces or edges of the frame 16 adapted to cooperate with suitable locator surfaces on the apparatus described herein.

The semiconductor packages 10 may be of various types. However, the apparatus of the invention is well-suited for singulating or cutting the packages 10 from the array provided by the substrate 12 wherein the packages comprise micro ball grid arrays (uBGA), for example. Those skilled in the art will recognize that similar types of semiconductor packages may be singulated or cut free from a supporting substrate with the apparatus of the invention.

Figure 3:
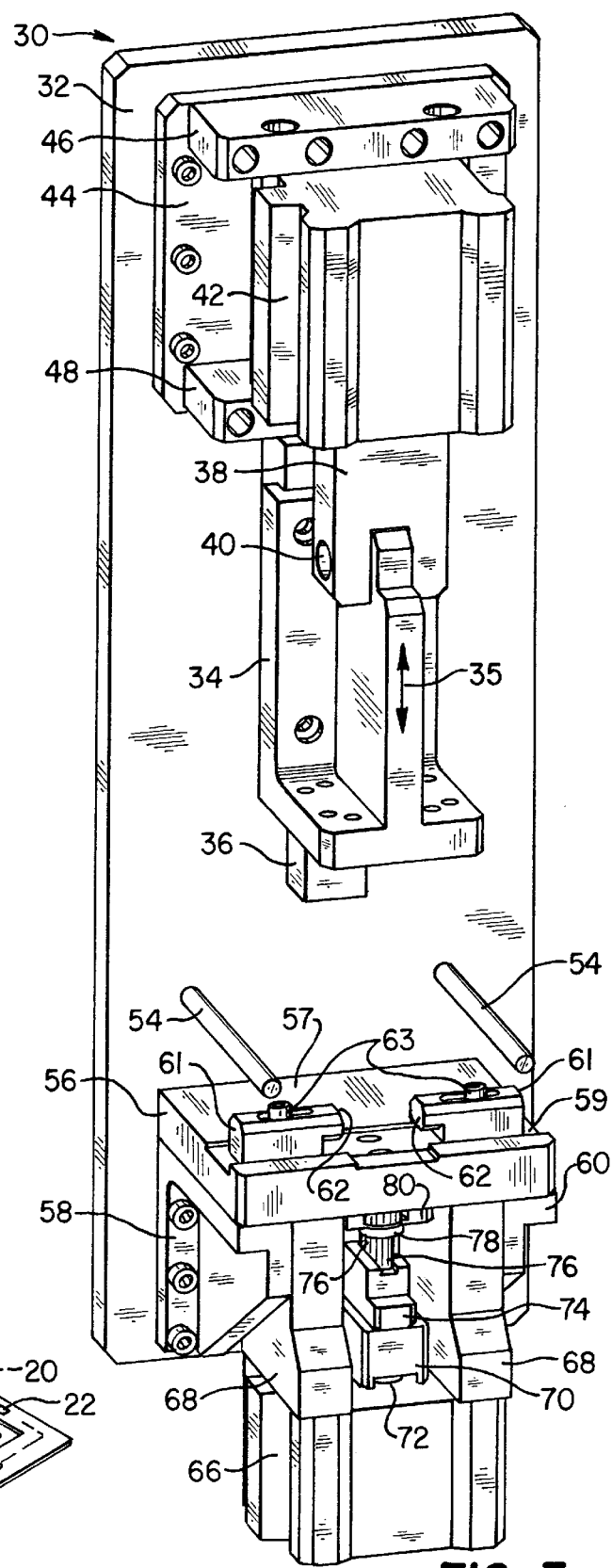
FIG. 3 is a perspective view of the apparatus shown in FIG. 2 with the upper and lower die assemblies removed.

Referring now to FIG. 2, there is illustrated an apparatus for effecting the aforementioned cutting or singulating operation and generally designated by the numeral 30. The apparatus 30 includes a support base 32 comprising a generally rectangular plate, see FIG. 3 also, which may be oriented in a vertical or horizontal direction, preferably vertical as illustrated, and adapted to support an upper die platen 34 for reciprocal movement in the direction of an arrow 35 on a suitable elongated rectangular cross section slide guide 36 secured to the support base 32. The platen 34 is suitably connected to a actuator adapter member 38 by a pin 40. The adapter 38 is connected to a reciprocable piston rod 39 of a pressure fluid cylinder type actuator 42, FIG. 2, which is suitably mounted on the support base 32 by a support plate assembly including a base plate 44 and upper and lower support plates 46 and 48. As shown in FIG. 2 only, the upper die platen 34 is adapted to support an upper die assembly 50, which will be described in further detail herein, for reciprocal movement toward and away from a lower die assembly 52, which will also be described in further detail herein. As shown in FIGS. 2 and 3, spaced apart elongated cylindrical support pins 54 project from the support base 32 above and adjacent to the lower die platen 56 for supporting a carrier frame 16 when the apparatus is being operated to cut semiconductor packages 10 from the substrate 12 in the manner to be described.

Referring further to FIGS. 2 and 3, the lower die assembly 52 is supported on a lower die platen 56 which is supported by the support base 32 on opposed platen support brackets 58 and 60, FIG. 3. The lower die platen 56 includes a generally planar top surface 57 in which a transverse slot 59 is formed, FIG. 3, for supporting two opposed lower die clamps 61 having oppositely projecting trunnion portions 62. The clamps 61 may be adjustably locked in selected working positions in the slot 59 by suitable threaded fasteners 63, FIG. 3.

Referring further to FIG. 3, in particular, the apparatus 30 is further characterized by a pressure fluid piston and cylinder type actuator 66 which is mounted on the apparatus by opposed spaced apart support plates 68 which are also connected to the platen 56. A lower cylinder adapter member 70 is operably connected to an extensible piston rod 72 and to a shaft holder 74 which supports two spaced apart die assembly actuator shafts 76 slidably disposed in support bushings 78, one shown in FIG. 3. Bushings 78 are supported in a suitable holder member 80 mounted on the underside of the platen member 56. The actuators 42 and 66 may be of other types suitable to provide for reciprocating movement of the members actuated by the actuators 42 and 66.

Figures 4, 5, 8:
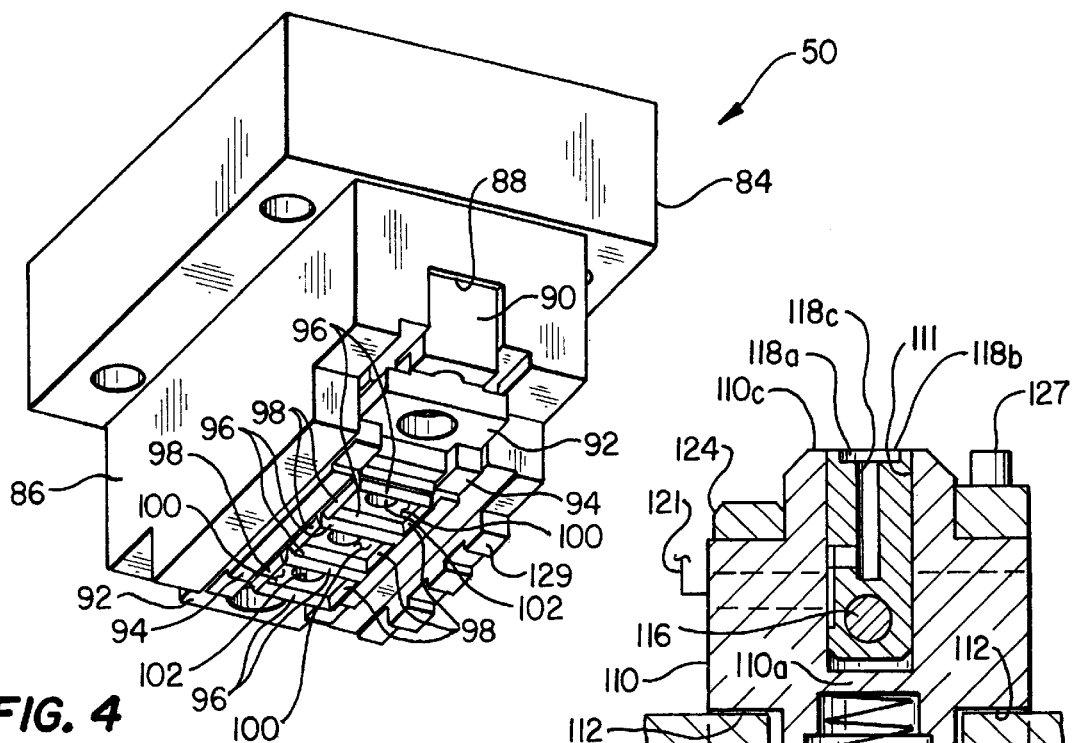
FIG. 4 is a perspective view of the upper die assembly of the apparatus.
FIG. 5 is a perspective view of the lower die assembly of the apparatus.
FIG. 8 is a section view taken generally along line 8—8 of FIG. 2.

Referring now to FIG. 4, the upper die assembly 50 includes a generally rectangular support plate or shoe 84 which is adapted to be secured to the platen 34 by suitable mechanical fasteners, not shown. The shoe 84 supports an upper die support block 86 having a downwardly facing elongated rectangular slot 88 formed therein and in which is disposed a cutter blade holder member 90. Opposed upper blade clamps 92 are operable to retain opposed so-called width cutter blade members 94 on die assembly 50, each having plural spaced apart downwardly projecting linear width cutter blades 98 formed thereon, as shown. The upper blade clamps 92 are also adapted to retain spaced apart pairs of downwardly projecting linear length cutter blades 96 in blade holder 90. Accordingly, a pair of opposed length blades 96 is disposed adjacent a pair of opposed width cutter blades 98 to form a rectangular cutter assembly for effecting cutting the composite layers of material supporting one of the semiconductor packages 10, as previously described. As illustrated in FIG. 4, three sets of length blades 96 and width blades 98, respectively, are supported on the die assembly 50 to provide three separate rectangular cutter blade means for cutting three packages 10, simultaneously, from substrate 12 and to effect such cutting action advantageously at a single station which will be described in further detail herein.

Figure 6A:
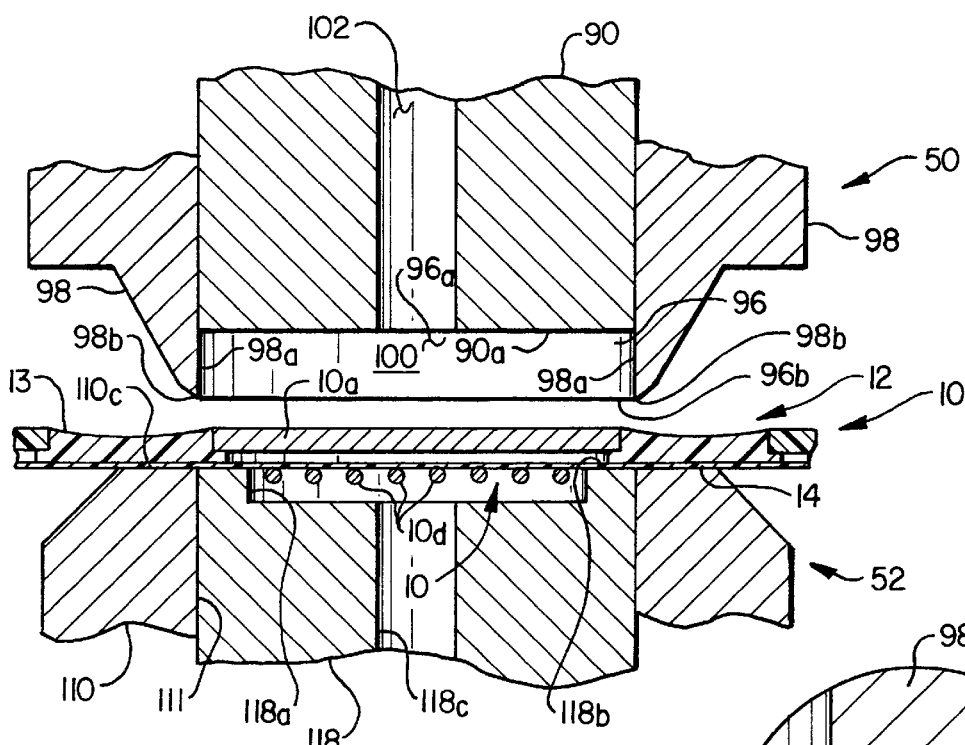
FIGS. 6A through 6D are section views taken generally from line 6A—6A of FIG. 2, and showing the steps in cutting or singulating a semiconductor package from an array thereof in accordance with the apparatus and method of the invention.

Referring briefly to FIG. 6A also, the arrangements of opposed pairs of length cutting blades 96 and width cutting blades 98 each forms a generally rectangular recess 100 delimited by the sidewalls 96a and 98a of the cutting blades and by a transverse downwardly facing planar surface 90a of the blade holder 90. Accordingly, three recesses 100, FIG. 4, are formed by the respective sets of length blades 96 and width blades 98 arranged in the rectangular patterns shown. Three spaced apart pressure fluid conducting passages 102, one shown in FIG. 6A, extend through the blade holder 90 and intersect the surfaces 90a, as illustrated. The passages 102 are adapted to be selectively in communication with a suitable source of vacuum or pressure fluid, such as compressed air, for purposes to be explained in further detail herein.

As will be appreciated from the foregoing discussion, the sets of opposed length cutting blades 96 and width cutting blades 98 which form the three rectangular recesses 100, together with the blade holder 90, form a cutting die operable to simultaneously cut through the substrate 12 for three side by side disposed semiconductor packages 10.

Referring now to FIGS. 5 and 8, the lower die block 110 includes opposed, generally rectangular transverse recesses 112, one shown in FIG. 5, formed therein for receiving the trunnion portions 62 of the lower die clamps 61, respectively. The die block 110 includes opposed upward and downward facing elongated longitudinal slots 111 and 113, the latter slot being adapted to receive a spring holder member 114 therein. The spring holder member 114 supports a longitudinally extending shaft 116 which also extends through the slot 111. The holder member 114 is preferably biased to move downwardly, viewing FIGS. 5 and 8, in the slot 113 under the urging of one or more compression springs 115, FIG. 8, interposed between the holder member and a transverse bridge portion 110a of the die block 110.

Spaced apart, generally rectangular punch members 118 are supported on the die block 110 between respective spaced apart separator plates 120, FIG. 5. The respective punch members 118 are disposed for vertical reciprocal movement in slot 111 and are each provided with rectangular recesses 118a formed in a generally horizontal, planar, upward facing surface 118b. The punch members 118 are each operably connected to the shaft 116, see FIG. 8 by way of example, and are disposed for sliding movement in generally rectangular bores 119 formed by the die block 110 and the respective separators 120. Punch members 118 each include a central passage 118c operable to be in fluid flow communication with a vacuum source or pressure fluid source by way of a suitable conduit 121, FIG. 8, in communication with suitable passage means in block 110, not shown.

The separators 120 are retained in their working positions shown in FIG. 5 by a clamp plate 124 and a die locator block 126, both suitably secured to the die block 110. The locator block 126 has a toothed die registration and locator portion 127 cooperable with a corresponding toothed registration and locator portion 129, FIG. 4, formed on the upper die block 86 for locating the die assemblies 50 and 52 substantially precisely relative to each other when the platen 34 is moved downwardly, viewing FIGS. 2 and 3, toward the platen 56. The cooperating locator portions 127 and 129 are precisely dimensioned to limit the downward movement of die assembly 50 toward die assembly 52.

Referring again to FIG. 5, the lower die assembly 52 is also provided with opposed carrier frame locator blocks 130 which are adapted to be mounted on opposite ends of the die block 110 by suitable fasteners, not shown. The carrier frame locator blocks 130 are each provided with an upwardly projecting carrier frame locator pin 132. The locator pins 132 are aligned with the centerlines of the punches 118 and with each other so that when a carrier frame 16 is placed on the die block surface 110c with a set of three semiconductor packages 10 aligned with the punches 118, a pair of holes or openings 22 in the carrier frame 16 will be aligned with and in registration with the pins 132. Thus, the locator pins 132 will hold the carrier frame 16 in proper position to permit cutting and singulating the semiconductor packages 10 from the substrate 12. Suitable recesses, not shown in FIG. 5, are formed in the carrier frame locator blocks 130 to provide clearance for the opposite ends of the spring holder member 114 when the blocks 130 are connected to the die block 110.

Other means of locating the carrier frame 16 and a substrate thereon relative to the punch members 118 may be used, as mentioned hereinabove.

In response to energization of the cylinder actuator 66, piston rod 72 moves the assembly of the adapter 70, shaft holder 74 and the shafts 76 upwardly into engagement with the actuator and return spring holder member 114. This action moves the actuator and return spring holder member 114 upwardly in the slot 113 compressing the return springs 115 while moving the shaft 116 and the punch members 118 upwardly in the die block slot 111. When the actuator 66 is deenergized the return springs 115 return the punch members 118 and the actuator and return spring holder member 114 to the retracted position shown in FIGS. 5 and 8. As described previously, when the cylinder actuator 42 is energized, the platen 34 moves the upper die assembly 50 downwardly until the locator blocks 127 and 129 are in registration with each other to limit the downward movement of the upper die assembly 50. The actuator 42 may be a spring return type actuator or double acting under the urging of pressure fluid and, in response to operation of suitable controls, not shown, the actuator 42 may move the platen 34 and the die assembly 50, at will.

Figure 6B:
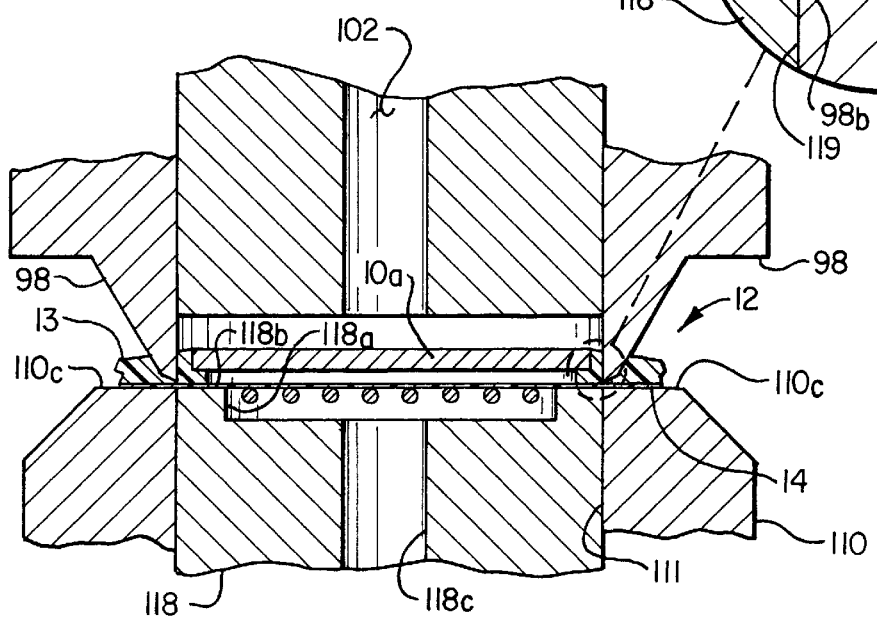

Referring now to FIGS. 6A and 6B, there is illustrated a portion of the sequence of operating steps of the apparatus 30 to cut a semiconductor package (or packages) 10 from a substrate 12 having a plurality of such packages formed thereon to "singulate" or singularize the packages to prepare them for further processing. As shown in FIG. 6A, when the punch members 118, one shown, are retracted such that transverse planar top surface 118b is substantially co-planar with the surface 110c of the die block 110, a carrier frame 16 may be placed on the surface 110c and also supported by the support pins 54, not shown in FIG. 6A. A pair of carrier frame locator holes 22 is placed in registration with the locator pins 132, also not shown in FIG. 6A, so that a row of three semiconductor packages 10 will be aligned with the punch members 118, as shown, for one of the packages and one of the punch members in FIG. 6A. The die assembly 50 will normally be retracted further upwardly than shown in FIG. 6A, but the position of the die assembly 50 in FIG. 6A is illustrated for purposes of describing the operation of the die assembly 50 and the die assembly 52.

With each of the semiconductor packages 10 of an array of packages being located over a punch member 118 and with package electrical leads 10d disposed in the respective recesses 118a, the semiconductor packages 10 will be properly positioned for cutting through the substrate 12 including the elastomer sealant layer 13 and the film or tape layer 14. A slight vacuum may be applied to passages 118c and recesses 118a to hold the packages 10 firmly in position on surface 110c, 118b.

Figure 7:
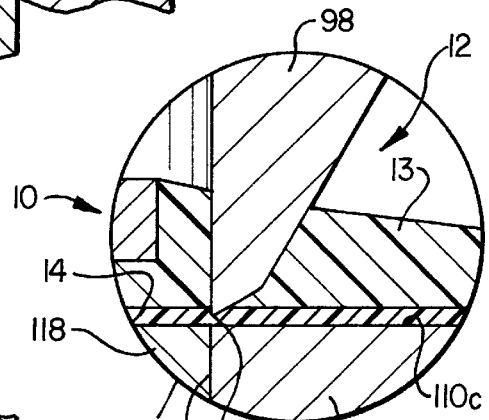
FIG. 7 is a detail view on a larger scale showing the position of the knife edges of the cutting blade assembly on completion of the cutting step of FIG. 6B.

Referring now to FIGS. 6B and 7, when a row of semiconductor devices 10 is properly positioned, as shown in FIGS. 6A and 6B, for cutting the packages away from the substrate 12, the upper die assembly 50 is actuated to move downwardly to the position shown in FIG. 6B wherein the respective sets of cutter blades 96 and 98 making up a cutter blade assembly associated with each punch 118 makes a rectangular cut in the substrate 12 whereby the blade cutting edges 96b and 98b cut through the elastomer sealant layer 13 and partially through the film or tape layer 14, as indicated in FIG. 7.

At this time, the surfaces 118b of the punch members 118 are still co-planar with the surface 110c of the die block 110. Accordingly, a substantial, clean cut is made in the substrate 12 to substantially singulate each of the semiconductor packages 10. However, the portion of tape or film layer 14 within the confines of a set of cutter blades 96 and 98 and the associated backing or package member 10a of the semiconductor package 10 remain intact and also with a peripheral layer of elastomer sealant 13 around member 10a. However, since the semiconductor package 10a has not been completely severed from the substrate 12, the apparatus 30 proceeds to provide such separation as indicated in FIG. 6C.

Figure 6C:
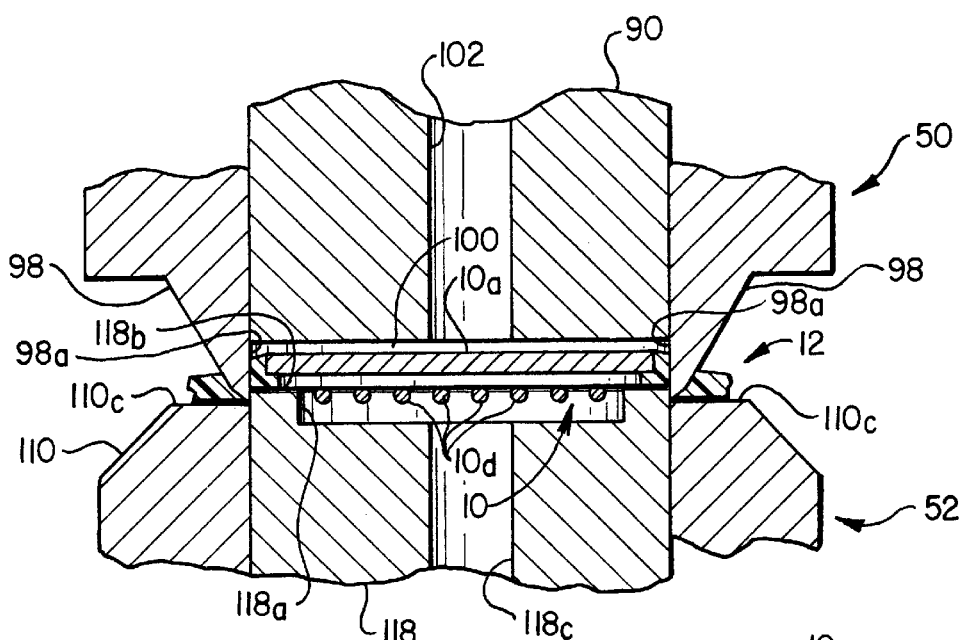
Figure 9:
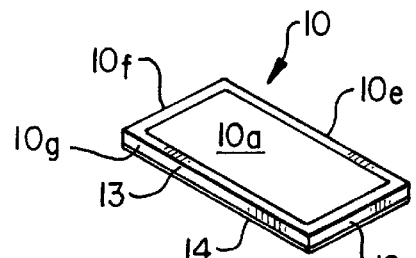
FIG. 9 is a perspective view of a semiconductor package after the completion of the cutting or singulation operation.

Referring to FIG. 6c, after the die assembly 50 has moved downward to its limit position relative to the die assembly 52 to provide a substantial cut through the substrate 12 described above, the cylinder actuator 66 is energized to move the punch members 118 upwardly relative to the die block 110 and the die assembly 50 to complete the cutting action to separate semiconductor packages 10 from the substrate 12, as shown. As indicated in FIG. 6C, the punch members 118 are moved upwardly until the support surfaces 118b, one shown in FIG. 6c, move out of the plane of the surface 110c, while the cutter blades 96 and 98 remain in a fixed position relative to the surface 110c. In this way, a semiconductor package 10 is cleanly severed from the substrate 12 to form four cleanly cut transverse edges 10e, 10f, 10g, 10h, see FIG. 9, defining the outline of a package 10. The depth of recess 100 is sufficient to allow the action taken by the apparatus 30 between the position of the members 118 shown in FIG. 6B and the position shown in FIG. 6C.

On completion of the cutting action provided by movement of the punch members 118 upwardly, as shown in FIG. 6C, the vacuum in passages 118c and recesses 118a is released and a vacuum may be applied in recesses 100 via passages 102, respectively, to hold the packages 10 in the recesses 100. The punch members 118 are retracted to their original position as shown in FIG. 6D, and the die assembly 50 is also retracted upwardly while retaining the semiconductor packages 10 in the respective recesses 100 formed by the sets of cutter blades 96 and 98, respectively.

Figure 6D:
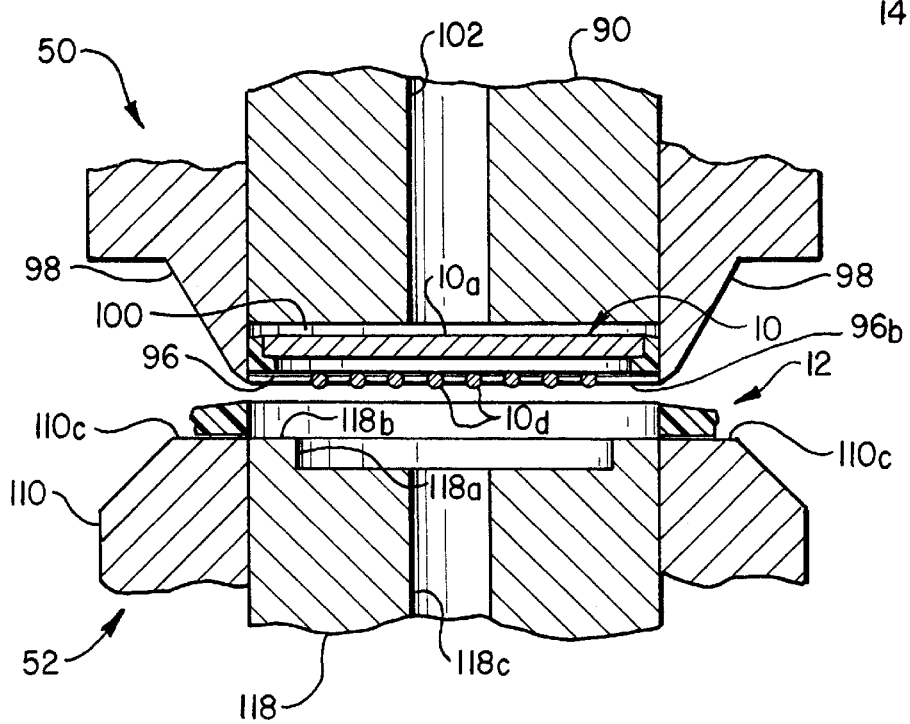

When the upper die assembly 50 is retracted to the position shown in FIG. 6D, each of the semiconductor packages 10 which has been singulated is retained in a recess 100 by the aforementioned vacuum force and by frictional engagement of the side edges of the semiconductor package with the sidewalls 96a and 98a of the respective cutter blades. Once the die assembly 50 has been fully retracted away from die assembly 52, a suitable semiconductor package handling mechanism, not shown, is moved into position under the die assembly 50 for receiving the respective semiconductor packages 10 which are being retained in the recesses 100.

The semiconductor packages 10 are then forcibly ejected from the recesses 100 by introducing compressed air into the passages 102 to remove the packages from the recesses. The packages 10 may then be deposited by the aforementioned handling mechanism on a tray or tape and conducted away from the apparatus 30 for further processing.

After a set of three semiconductor packages 10 has been singulated or separated from the substrate 12, the carrier frame 16 is then indexed to the next position for which a set of semiconductor packages 10 is to be separated from the substrate and the process described above and shown in FIGS. 6A through 6D is repeated.

Thanks to the configuration of the apparatus 10, a complete cutting action is provided to separate the packages 10, cleanly, without any misalignment of the packages with respect to the cutting blades and without forming any ragged edges or slivers of substrate material which would likely occur if the carrier frame 16 was required to be indexed or moved between plural cutting stations.

Moreover, by providing the arrangement of the cutting blades 96 and 98 and the punch members 118, the blades 96 and 98 remain in a sharpened condition for a longer period of time since the blade edges 96b and 98b do not require forcible engagement with a hard surface in order to complete the cutting action to cleanly separate a semiconductor package from a substrate. Still further, the packages 10 are advantageously retained in the recesses 100 until they are forcibly discharged therefrom, at will.

The construction and operation of the apparatus 30 is believed to be understandable to one of skill in the art from the foregoing description. The apparatus 30 may be constructed using conventional engineering materials for semiconductor package handling and processing apparatus. Suitable controls, not shown, may be provided to control the operation of the actuators 42 and 66 and the introduction of vacuum or compressed air to the passages 102 and 118c, as needed.

Although preferred embodiments of the invention have been described in detail, those skilled in the art will also recognize that various substitutions and modifications may be made to the apparatus and the method of operation without departing from the scope and spirit of the appended claims.

What is claimed is:

1. A method for separating a semiconductor package from a substrate by cutting an outline on said substrate defining the periphery of said semiconductor package, said method comprising:

supporting said substrate on a surface;

moving a cutting device toward said surface in a first direction to a predetermined maximum position and cutting an outline of said semiconductor package at least partially through said substrate; and moving a member in a second direction opposite the first direction with said member engaging said substrate such that said semiconductor package is moved in said second direction with said member relative to a remainder of said substrate outside of said periphery to complete the separation of said semiconductor package from said substrate without moving said substrate relative to said surface.

2. The method set forth in claim 1 including:

providing a semiconductor package singulation apparatus for separating at least one semiconductor package from said substrate, said apparatus including a first die assembly including said cutting device for cutting said substrate and a second die assembly including said member for moving said semiconductor package and said surface for at least partially supporting said substrate during cutting of said substrate by said cutting device, said member including a movable punch member engageable with said substrate;

placing said substrate in a predetermined position relative to said first and second die assemblies;

moving said first die assembly relative to said second die assembly in said first direction to cause said cutting device to cut at least partially through said substrate; and moving said punch member relative to said substrate in said second direction to effect final cutting of said substrate to separate said semiconductor package therefrom.

3. The method set forth in claim 2 wherein:
said first die assembly is moved to said predetermined maximum position relative to said second die assembly to effect cutting entirely through a sealant layer of said substrate and partially through a film layer of said substrate prior to moving said punch member relative to said second die assembly.

4. The method set forth in claim 2 including:
retaining said semiconductor package connected to one of said die assemblies subsequent to separating said semiconductor package from said substrate.

5. The method set forth in claim 4 wherein:
retaining said semiconductor package connected to one of said die assemblies comprises retaining said semiconductor package connected to said first die assembly with a vacuum force.

6. The method set forth in claim 5 including:
removing said semiconductor package from said first die assembly.

7. The method set forth in claim 6 wherein:
removing said semiconductor package from said first die assembly includes impinging air under pressure on said semiconductor package.

8. The method set forth in claim 2 including:
retaining said substrate secured to said second die assembly with a vacuum force.

9. The method set forth in claim 2 and further comprising:
providing spaced apart locator pins on said second die assembly;
providing a carrier frame for supporting said substrate, said carrier frame including locator openings formed therein; and
moving said carrier frame into a position in registration of said openings with said locator pins to locate said semiconductor package relative to said cutting device and said punch member, respectively.

10. The method set forth in claim 2 including:
providing a passage in said punch member for communication with a source of one of a vacuum and pressure to selectively retain said semiconductor package on and remove said semiconductor package from said second die assembly.

11. The method set forth in claim 1, wherein said predetermined maximum position is spaced from said surface.

12. The method set forth in claim 1, wherein engaging the substrate with said movable member includes engaging the substrate at the periphery of the semiconductor package.

13. The method set forth in claim 1, wherein engaging the substrate with said movable member includes engaging the substrate at the periphery of the semiconductor package.

14. A method for separating a semiconductor package from a substrate characterized by a generally planar film layer and a sealant layer, said semiconductor package being at least partially encapsulated by said sealant layer, said method comprising:
providing a semiconductor package singulation apparatus for separating at least one semiconductor package from said substrate, said apparatus including a first die assembly including a cutter blade for cutting said substrate and a second die assembly for at least partially supporting said substrate during cutting of said substrate by said cutter blade, said second die assembly including a movable punch member engageable with said substrate;
placing said substrate in a predetermined position relative to said first and second die assemblies;
moving said first die assembly relative to said second die assembly in a first direction to a predetermined maximum position to cause said cutter blade to cut through said sealant layer and at least partially through said film layer about a periphery of said semiconductor package; and
moving said punch member relative to said substrate in a second direction opposite the first direction with said punch member engaging said substrate to effect final cutting of said film layer to separate said semiconductor package from a remainder of said substrate outside of said periphery.

15. The method set forth in claim 14, wherein said predetermined maximum position is spaced from said punch member prior to moving said punch member.

16. The method set forth in claim 14, wherein engaging the substrate with said punch member includes engaging the substrate at the periphery of the semiconductor package.

* * * * *